United States Patent
Fournel et al.

(10) Patent No.: US 6,778,440 B2
(45) Date of Patent: Aug. 17, 2004

(54) METHOD AND DEVICE FOR CHECKING A GROUP OF CELLS IN A NON-VOLATILE MEMORY CELLS

(75) Inventors: Richard Fournel, Lumbin (FR); Leila Sedjai Aitouarab, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/363,234

(22) PCT Filed: Jan. 30, 2002

(86) PCT No.: PCT/FR02/00361

§ 371 (c)(1),
(2), (4) Date: Mar. 5, 2003

(87) PCT Pub. No.: WO02/063632

PCT Pub. Date: Aug. 15, 2002

(65) Prior Publication Data

US 2003/0174556 A1 Sep. 18, 2003

(30) Foreign Application Priority Data

Feb. 2, 2001 (FR) .............................................. 01 01442

(51) Int. Cl.[7] .............................................. G11C 16/06
(52) U.S. Cl. .............................. 365/185.21; 365/185.2; 365/189.07
(58) Field of Search ........................ 365/185.21, 185.2, 365/189.07, 189.09, 210, 207, 185.22

(56) References Cited

U.S. PATENT DOCUMENTS 5,886,925 A * 3/1999 Campardo et al. ...... 365/185.21

* cited by examiner

Primary Examiner—David Lam
(74) Attorney, Agent, or Firm—Lisa K. Jorgenson; Allen, Dyer, Doppelt, Milbrath & Gilchrist, P.A.

(57) ABSTRACT

An electrical state of a group of N cells of a non-volatile memory are simultaneously checked. The group of N memory cells to be checked, along with a checking cell, are simultaneously selected and read. The N signals read are summed to obtain a summed signal. The summed signal is compared with the signal read from the checking cell to provide a first state signal when the summed signal is less than the signal read from the checking cell. This indicates that the N memory cells are in a first electrical state. If a second state signal is provided in the comparison, this indicates that at least one memory cell is not in the first electrical state when the summed signal is greater than the signal read on the checking cell.

22 Claims, 2 Drawing Sheets

METHOD AND DEVICE FOR CHECKING A GROUP OF CELLS IN A NON-VOLATILE MEMORY CELLS

FIELD OF THE INVENTION

The present invention relates to integrated circuit memory devices, and more particularly, to nonvolatile memories such as an electrically programmable read only memory (EPROM), an electrically erasable and programmable read only memory (EEPROM) and a FLASH EEPROM that is erasable by groups of memory cells. In these non-volatile memories, the present invention concerns a method and device for controlling a group of memory cells to check whether they are all in the same electrical state.

BACKGROUND OF THE INVENTION

In non-volatile memories, it is necessary to check whether a group of memory cells are all in the same electrical state. This check is necessary in many circumstances, for instance, in memory manufacturing test operations or during use of the memory in an electronic system such as a microprocessor.

At present, such a check is carried out cell by cell by selecting each cell in a readout mode and comparing the read signal with a reference signal supplied by a reference cell. The reference cell which is identical to the memory cell. This checking process is time consuming and labor intensive.

SUMMARY OF THE INVENTION

In view of the foregoing background, an object of the present invention is to quickly check the electrical state of memory cells in an integrated circuit memory.

This and other objects, advantages and features in accordance with the present invention are provided by simultaneously reading the memory cells in groups of N cells, summing the N read signals and comparing their sum to a reference signal supplied by a reference cell for determining whether the N memory cells of the group are in the same electrical state.

One aspect of the invention is directed to a method of simultaneously checking the electrical state of a group of N memory cells in a non-volatile type memory, where each cell of the memory can take on a first electrical state or a second electrical state.

The memory further comprises at least one memory cell, designated a checking cell, which is in the second electrical state but exhibits a readout characteristic curve that is modified relative to the other cells of the memory.

The method preferably comprises simultaneously selecting in readout the N memory cells to check as well as the checking cell, and summing the N read signals to obtain a summed signal. The summed signal is compared with the signal read on the checking cell to provide a given state signal when the summed signal is less than the signal read on the checking cell. This indicates that the N memory cells are in the first electrical state. If another state signal is given, this indicates that at least one memory cell is not in the first electrical state when the summed signal is greater than the signal read on the checking cell.

Another aspect of the invention is directed to a device for simultaneously checking the electrical state of a group of N memory cells in a non-volatile type memory, where each memory cell can take on a first electrical state or a second electrical state.

The memory device preferably further comprises at least one memory cell, designated a checking cell, which is in the second electrical state but exhibits a readout characteristic curve that is modified relative to the other cells of the memory. The memory device also comprises means for simultaneously selecting in readout the N memory cells to check, as well as the checking cell.

The memory device preferably further comprises means for summing the N signals read in the N memory cells to obtain a summed signal, and comparison means for comparing the summed signal with the signal read in the checking cell. The comparison means supplies a first state signal when the N memory cells are all in the same abovementioned electrical state, and a second state signal when just one memory cell among N is in the second electrical state.

BRIEF DESCRIPTION OF THE DRAWINGS

Other characteristics and advantages of the present invention shall become more apparent from reading the following description of a specific embodiment, the description being given with reference to the appended drawings in which.

DETAILED DESCRIPTION OF THE PREFERRED EMBODIMENTS

Figure 1:
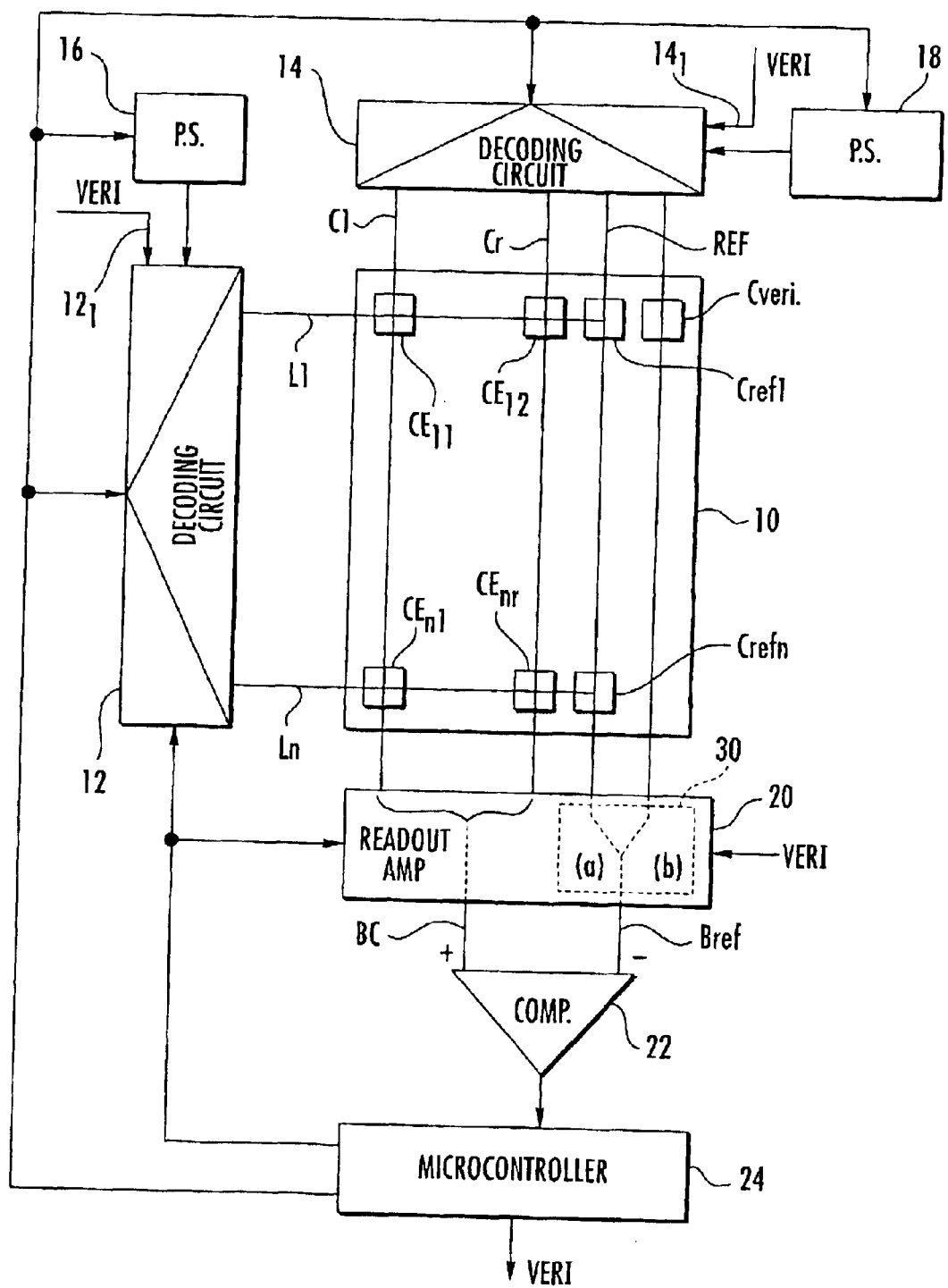
FIG. 1 is a simplified diagram of a device for checking a group of memory cells in accordance with the present invention.
Figure 2:
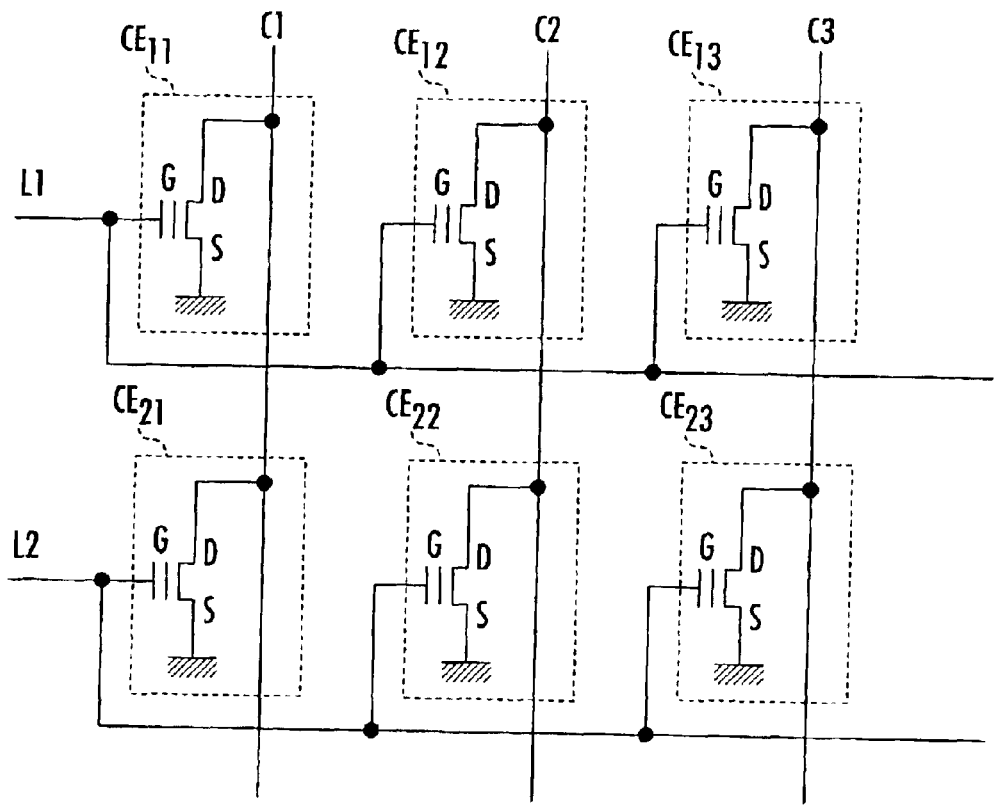
FIG. 2 is a diagram showing the memory cells that are part of the memory illustrated in FIG. 1.

The diagram of FIG. 1 shows a memory 10 whose memory cells CE are organized in n lines or rows numbered L1 to Ln, and r columns numbered C1 to Cr. Each memory cell CE is at the intersection of a row L and a column C as shown by the diagram of FIG. 2 for two rows L1 and L2 and three columns C1, C2 and C3.

Each memory cell CE comprises (FIG. 2) a MOSFET, e.g., an insulated gate N-type transistor. The source S of this transistor is connected to ground, the drain is connected to a column C1, C2 or C3 and the gate G is connected to a row L1 or L2.

The memory 10 comprises an additional column REF comprising an additional memory cell Cref at each row L1 to Ln (Cref1 to Crefn) to provide a reference memory cell when reading another cell of the same row. It is the comparison between the signal read on a memory cell CE and the signal read on the reference cell Cref of the same row that determines the binary content 0 or 1 of the cell.

The selection of a row and a column, and hence a cell CE, is obtained respectively by address decoding circuits 12 and 14. The address decoding circuits 12, 14 each cooperate respectively with a power supply circuit 16 and 18 so as to apply the appropriate voltage values to write into and read from the memory cells.

The output terminals of all the columns are each connected to an input terminal of a readout amplifier illustrated collectively by circuit 20. The output terminals of the amplifiers 20 corresponding to columns C1 to Cr are connected to a same input terminal BC of a comparator 22. The other input terminal Bref is connected to the output terminal of the amplifier corresponding to reference column REF.

The address signals and other control signals of the memory 10 are supplied in a known manner by a microprocessor or microcontroller 24. The microcontroller 24 may be part of a test system external to the memory 10 or operates directly with the memory.

Figure 3:
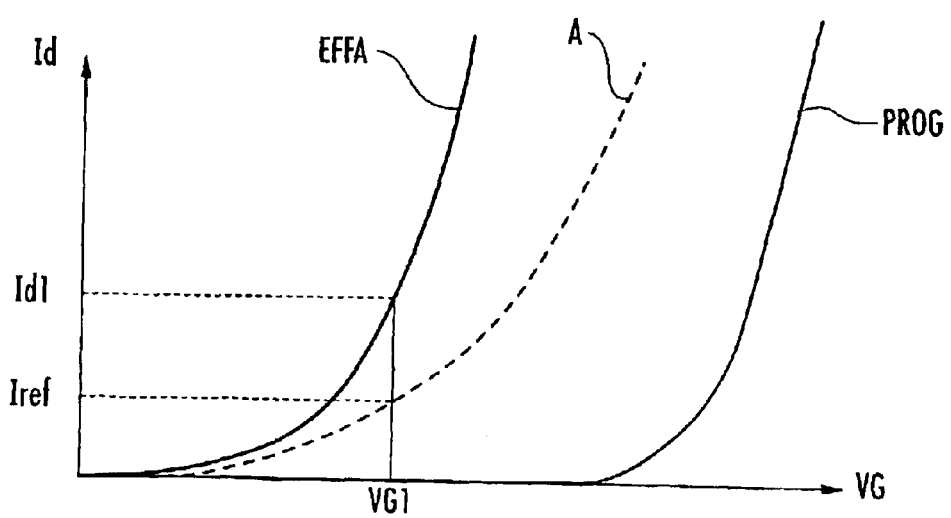
FIG. 3 is a diagram of curves showing the variation of current drain versus gate voltage as a function of the memory state in accordance with the present invention.

The operation of the memory 10 shall now be briefly described in conjunction with the diagram of FIG. 3. The drain/source current Id of a memory cell varies as a function of the voltage VG applied to the gate G according to the curve EFFA for a binary digit 1, and according to the curve PROG for a binary digit 0. In the case of a FLASH memory, and by convention, curve EFFA corresponds to an erase operation of the cell while curve PROG corresponds to a write (programming) operation.

The intermediate curve indicated by dotted line A belongs to a reference cell Cref, and corresponds to a memory cell CE in the erased state but with a different gain value at the output that is less than one. This gain is obtained by amplifier 20 connected to the reference column REF.

During a read operation, a gate voltage VG1 is applied between the two curves EFFA and PROG, and the current Id1 of the cell CE and the current Iref of the reference cell Cref are measured. If Id1 is less than Iref, the memory cell is at a state 0 according to the adopted convention (PROG curve). If Id1 is greater than Iref, the memory cell is at a 1 state (EFFA curve). This comparison is performed for each memory cell of the selected line by the successive selection of columns using address circuit 14.

In this type of memory, prior to recording 0 and 1 binary information therein, all the cells are placed the same state, for example, the 0 state corresponding to the PROG curve of FIG. 3. Accordingly, when a memory cell is to store the binary digit 0, no operation is performed. Conversely, to store the binary digit 1, operations are performed to bring the cell into the state of curve EFFA.

For proper operation of the system, it is fundamentally important that all the cells be in the same 0 state prior to storing information. At present, a check is performed by reading cell by cell. The invention proposes a method and device for carrying out this check by groups of cells. The invention selects for readout the cells to check by groups of N, where N can be variable according to requirements.

The address/decoding circuits 12 and 14 are provided to select several rows (p) and several columns (q) such that p×q=N, upon receiving a signal VERI supplied by the microcontroller 24 on an input terminal $12_1$ and $14_1$. The N read signals are summed, and their sum is compared in comparator 22 with the signal read in a checking cell Cveri.

In the case where just one row is selected for checking, the checking cell can be the reference cell at the intersection of the reference column REF with the selected row. However, the checking cell is preferably a cell provided for that purpose and which is formed in the memory 10. In the diagram of FIG. 1, this cell is represented by the reference Cveri and is selected by the signal VERI. It is connected to the input terminal of the comparator 22 via a two-position switch 30. In the absence of the signal VERI, the switch is in position (a) to connect the column REF of readout reference cells to the input terminal Bref of the comparator 22. In the presence of the signal VERI, the switch passes to position (b) and connects input terminal Bref of the comparator 22 to the checking cell Cveri.

There is a signal VERI for each grouped selection of memory cells CE, with each selection corresponding to a number N1, N2, N3, etc. of memory cells. Each signal VERI is respectively applied to a different input terminal $12_1$, $12_2$, $12_3$ or $14_1$, $14_2$, $14_3$ of the address circuits 12 and 14. For purposes of clarity, only input terminals $12_1$ and $14_1$ have been shown in FIG. 1. There is just one input terminal for the signal VERI on switch 30.

Comparator 22 supplies a first state signal when the sum of the read signals is less than Iref (FIG. 3), which corresponds to the N memory cells being in the same PROG state. On the other hand, it supplies a second state signal when the sum of the N read signals is greater than Iref, which corresponds to at least one memory cell being in the EFFA state. That is, the N memory cells selected are not all in the PROG state.

The invention is based on the fact that the readout current from a cell in the PROG state is very small, typically on the order of a pico-amp, so that the sum of the N currents is much less than Iref. This is while the current read in just one cell in the EFFA state is greater than Iref.

However, the number N and, more generally, the numbers N1, N2, N3 should be chosen such that in the course of the memory's lifetime, the sum of the N currents read in the programmed cells is always much less than Iref.

It is the memory manufacturer who determines the numbers N1, N2, N3 as well as the arrangement of memory cells that shall be selected by the choice of the number p of rows among n and the number q of columns among r. The manufacturer modifies the address circuits 12 and 14 to allow this selection by groups of N1, N2 and N3 cells from the different VERI signals, with one being used per group.

That which is claimed is:

1. A method for simultaneously checking an electrical state of a group of N memory cells in a non-volatile memory, with each memory cell being in a first or second electrical state, and the memory further comprising at least one memory cell designated as a checking cell being in the second electrical state and exhibiting a readout characteristic curve that is modified relative to a readout characteristic curve of the other memory cells, the method comprising:

simultaneously reading th group of N memory cells and the checking;

summing the signals read from the group of N memory cells to obtain a summed signal; and comparing the summed signal with the signal real from the checking cell to provide at least one of a first state signal when the summed signal is less than the signal read from the checking cell for indicating that the group of N memory cells are in the first electrical state, and a second state signal when the summed signal is greater than the signal read from the checking cell for indicating that at least one memory cell within the group of N memory cells is not in the first electrical state.

2. A method according to claim 1, wherein the number N selectively takes on different values; and wherein simultaneously reading the group of N memory cells and the checking cell is based upon a signal specific to one of the different values of N.

3. A method according to claim 2, wherein the memory further comprises a comparator for comparing the summed signal with the signal read from the checking cell; and a microcontroller connected to an output of the comparator for providing the signal specific to one of the different values of N.

4. A method according to claim 1, wherein the memory further comprises at least one reference memory cell; readout circuitry for summing the signals read from the group of N memory cells, and comprising a switch having a first input connected to the at least one reference memory cell and a second input connected to the checking cell; and a comparator having a first input for receiving the summed signal and a second input connected to an output of the switch.

5. A method according to claim 1, wherein the non-volatile memory comprises at least one of an electrically programmable read only memory (EPROM), an electrically erasable and programmable read only memory (EEPROM) and a FLASH EEPROM.

6. A method for simultaneously checking an electrical state of a group of N memory cells in a non-volatile memory comprises a plurality of memory cells including at least one memory cell designated as a checking cell, the method comprising:
   simultaneously reading the group of N memory cells and the checking;
   summing the signals read from the group of N memory cells to obtain a summed signal; and
   comparing the summed signal with the signal read from the checking cell to provide at least one of
      a first state signal when the summed signal is less than the signal read from the checking cell for indicating that the group of N memory cells are in the first electrical state, and
      a second state signal when the summed signal is greater than the signal read from the checking cell for indicating that at least one memory cell within the group of N memory cells is not in the first electrical state.

7. A method according to claim 6, wherein the checking cell is in a second electrical state, and exhibits a readout characteristic curve that is modified relative to a readout characteristic curve of the other memory cells.

8. A method according to claim 6, wherein the number N selectively takes on different values; and wherein simultaneously reading the group of N memory cells and the checking cell is based upon a signal specific to one of the different values of N.

9. A method according to claim 8, wherein the memory further comprises a comparator for comparing the summed signal with the signal read from the checking cell; and a microcontroller connected to an output of the comparator for providing the signal specific to one of the different values of N.

10. A method according to claim 6, wherein the memory further comprises at least one reference memory cell, readout circuitry for summing the signals read from the group of N memory cells, and comprising a switch having a first input connected to the at least one reference memory cell and a second input connected to the checking cell; and a comparator having a first input for receiving the summed signal and a second input connected to an output of the switch.

11. A method according to claim 6, wherein the non-volatile memory comprises at least one of an electrically programmable read only memory (EPROM), an electrically erasable and programmable read only memory (EEPROM) and a FLASH EEPROM.

12. A device for simultaneously checking an electrical state of a group of N memory cell being in a first or second electrical state, and the memory further comprising at least one memory cell designated as a checking cell being in the second electrical state and exhibiting a readout characteristic curve that is modified relative to a readout characteristic curve of the other memory cells, the device comprising:
   reading means for simultaneously reading the group of N memory cells and the checking cell;
   summing means for summing the signals read from the group of N memory cells to obtain a summed signal; and
   comparison means connected to said summing means for comparing the summed signal with the signal read from the checking cell to provide at least one of
      a first state signal when the summed signal is less than the signal read from the checking cell for indicating that the group of N memory cells are in the first electrical state, and
      a second state signal when the summed signal is greater than the signal read from the checking cell for indicating that at least one memory cell within the group of N memory cells is not in the first electrical state.

13. A device according to claim 12, wherein the number N selectively takes on different values; and wherein said reading means comprises address circuitry for selecting the group of N memory cells based upon a signal specific to one of the different values of N.

14. A device according to claim 13, further comprising a microcontroller connected to an output of said comparison means for providing the signal specific to one of the different values of N.

15. A device according to claim 12, wherein the memory further comprises at least one reference memory cell; and wherein the summing means comprises a switch having a first input connected to the at least one reference memory cell, a second input connected to the checking cell, and an output connected to said comparison means.

16. A device according to claim 12, wherein the non-volatile memory comprises at least one of an electrically programmable read only memory (EPROM), an electrically erasable and programmable read only memory (EEPROM) and a FLASH EEPROM.

17. A non-volatile memory comprising:
   a plurality of memory cells including at least one memory cell designated as a checking cell;
   address circuitry connected to said plurality of memory cells for simultaneously selecting a group of N memory cells and the checking cell;
   readout circuitry connected to said plurality of memory cells for simultaneously selecting a group of N memory cells and for summing the signal read therefrom to obtain a summed signal; and
   a comparator connected to said readout circuitry for comparing the summed signal with the signal read from said checking cell to provide at least one of
      a first state signal when the summed signal is less that the signal read from said checking cell for indicating that the group of N memory cells are in a first electrical state, and
      a second state signal when the summed signal is greater than the signal read from said checking cell for indicating that at least one memory cell within the group of N memory cells is not in the first electrical state.

18. A non-volatile memory according to claim 17, wherein the checking cell is in a second electrical state, and exhibits a readout characteristic curve that is modified relative to a readout characteristic curve of the other memory cells.

19. A non-volatile memory according to claim 17, wherein the number N selectively takes on different values; and wherein said address circuitry selects the group of N memory cells based upon a signal specific to one of the different values of N.

20. A non-volatile memory according to claim 19, further comprising a microcontroller connected to an output of said comparator for providing the signal specific to one of the different values of N.

21. A non-volatile memory according to claim 17, wherein said plurality of memory cells comprises at least one reference memory cell; and wherein said readout circuitry comprises a switch having a first input connected to said at least one reference memory cell, a second input connected to said checking cell, and an output connected to said comparator.

22. A non-volatile memory according to claim 17, wherein said plurality of memory cells are configured so that the memory comprises at least one of an electrically programmable read only memory (EPROM), an electrically erasable and programmable read only memory (EEPROM) and a FLASH EEPROM.

* * * * *

UNITED STATES PATENT AND TRADEMARK OFFICE
CERTIFICATE OF CORRECTION

PATENT NO. : 6,778,440 B2
DATED : August 17, 2004
INVENTOR(S) : Richard Fournel and Sedjai Aitouarab It is certified that error appears in the above-identified patent and that said Letters Patent is hereby corrected as shown below:

Title page,
Item [54], Title, delete "MEMORY CELLS" insert -- MEMORY --

Column 4,
Line 41, delete "real" insert -- read --

Column 5,
Line 15, delete "checking" insert -- checking cells --

Signed and Sealed this

First Day of March, 2005

JON W. DUDAS
*Director of the United States Patent and Trademark Office*